(12) United States Patent
Ishii

(10) Patent No.: US 11,190,720 B2
(45) Date of Patent: Nov. 30, 2021

(54) IMAGE SENSOR AND IMAGE CAPTURING APPARATUS

(71) Applicant: CANON KABUSHIKI KAISHA, Tokyo (JP)

(72) Inventor: Mie Ishii, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/923,547

(22) Filed: Jul. 8, 2020

(65) Prior Publication Data
US 2021/0014445 A1 Jan. 14, 2021

(30) Foreign Application Priority Data
Jul. 9, 2019 (JP) .............................. JP2019-127884

(51) Int. Cl.
*H04N 5/3745* (2011.01)
*H01L 27/146* (2006.01)
*H04N 5/378* (2011.01)
*H04N 5/369* (2011.01)
*H04N 5/361* (2011.01)

(52) U.S. Cl.
CPC ..... *H04N 5/3745* (2013.01); *H01L 27/14609* (2013.01); *H01L 27/14643* (2013.01); *H04N 5/378* (2013.01)

(58) Field of Classification Search
CPC ...... H04N 5/3745; H04N 5/378; H04N 5/379; H04N 5/361; H04N 5/37455; H01L 27/14643; H01L 27/14609; H01L 31/107
See application file for complete search history.

(56) References Cited

U.S. PATENT DOCUMENTS

| | | | |
|---|---|---|---|
| 2015/0115131 A1* | 4/2015 | Webster | H04N 5/369 250/208.1 |
| 2016/0099371 A1* | 4/2016 | Webster | H01L 27/14634 250/208.1 |
| 2019/0074315 A1* | 3/2019 | Yasu | G01S 7/4863 |
| 2019/0154850 A1* | 5/2019 | Nishihara | H04N 5/357 |
| 2020/0314375 A1* | 10/2020 | Nishino | H01L 31/02021 |
| 2021/0066356 A1* | 3/2021 | Sugizaki | H01L 27/1462 |

FOREIGN PATENT DOCUMENTS

JP 2019-009768 A 1/2019

* cited by examiner

*Primary Examiner* — Albert H Cutler
(74) *Attorney, Agent, or Firm* — Cowan, Liebowitz & Latman, P.C.

(57) ABSTRACT

An image sensor comprises a first circuit board and a second circuit board stacked so as to overlap each other. The first circuit board comprises a pixel region in which first pixels shielded from light and second pixels not shielded from light are arranged in a matrix. Each pixel has a photoelectric conversion unit and a circuit that outputs a pulse signal indicative of incidence of photon. The second circuit board comprises a counter region in which first counters that counts pulse signals from the first pixels and second counters that count pulse signals from the second pixels are arranged in a matrix, and a peripheral circuit region including a circuit that controls driving of the pixels and counters. At least part of the peripheral circuit region is arranged in a region that overlaps with the first pixels.

9 Claims, 11 Drawing Sheets

FIG. 3
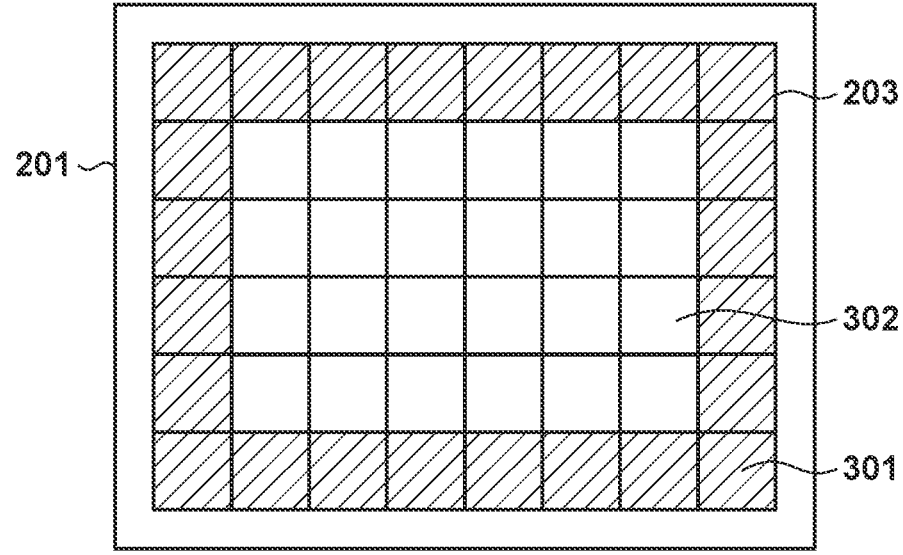
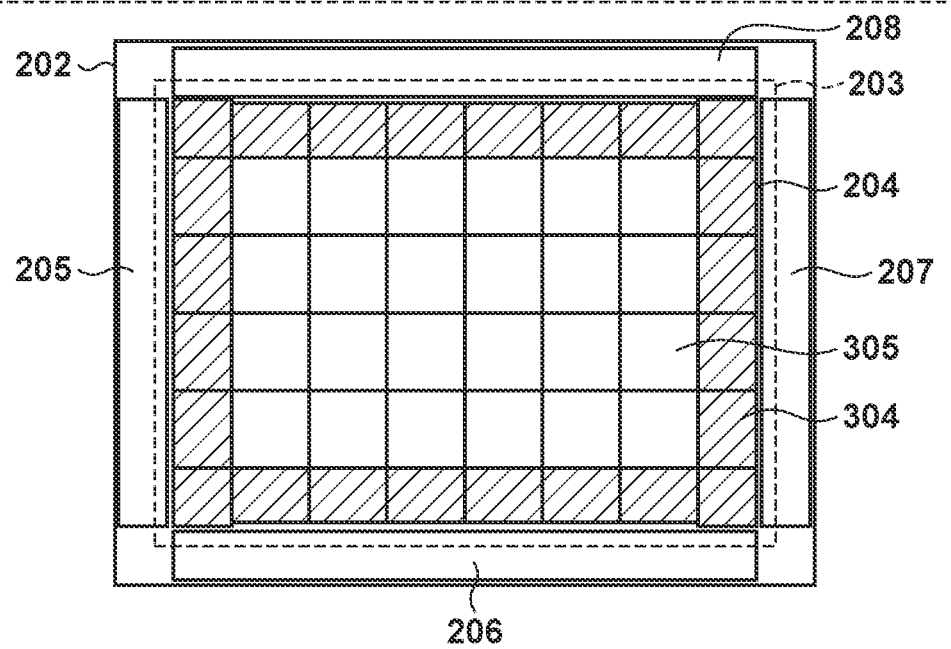

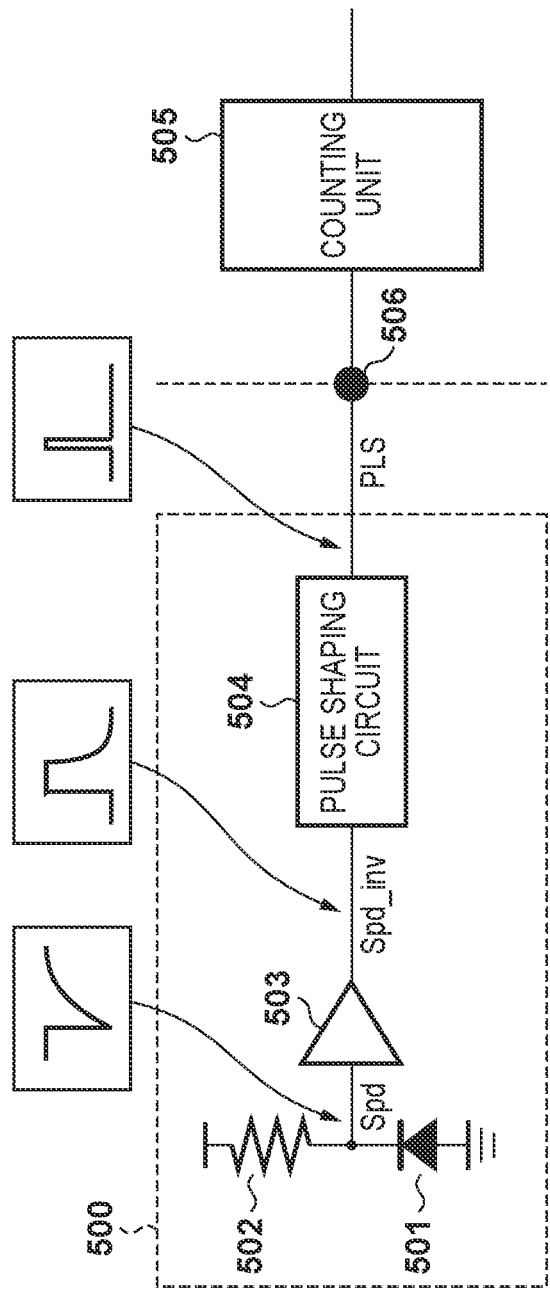

IMAGE SENSOR AND IMAGE CAPTURING APPARATUS

BACKGROUND OF THE INVENTION

Field of the Invention

The present invention relates to an image sensor and an image capturing apparatus.

Description of the Related Art

Conventionally, a technique for detecting a single photon by using an avalanche photodiode (APD) has been proposed. When a single photon is incident on an APD to which a reverse bias voltage higher than the breakdown voltage is applied, carriers are generated, avalanche multiplication occurs, and a large current is generated. A single photon can be detected based on this current. Japanese Patent Laid-Open No. 2019-009768 discloses a solid-state image sensor using APDs as light receiving elements.

Japanese Patent Laid-Open No. 2019-009768 also discloses an image sensor in which an upper substrate that includes light receiving elements and receives an optical image and a lower substrate that includes counting units that count the numbers of pulses emitted from the light receiving elements are stacked. By forming the counting unit having a large circuit scale on a substrate different from a substrate on which the light receiving elements are formed as described above, it is possible to secure the size of the light receiving area. In addition, on the lower substrate including the counting units, peripheral circuits such as horizontal and vertical scanning units for driving the image sensor, a timing generator, and so forth, are also arranged.

However, when a counting unit is provided for each pixel, the chip size becomes larger by the size of the area of the peripheral circuits necessary for driving the image sensor, and processing and outputting counted signals.

SUMMARY OF THE INVENTION

The present invention has been made in consideration of the above situation, and suppresses an increase in the chip size of an image sensor which counts the number of photons incident on each pixel.

According to the present invention, provided is an image sensor in which a first circuit board and a second circuit board which is different from the first circuit board are stacked so as to overlap each other, wherein the first circuit board comprises a pixel region in which a plurality of pixels are arranged in a matrix, each pixel having a photoelectric conversion unit and a circuit that outputs a pulse signal indicative of incidence of photon in response to incidence of light on the photoelectric conversion unit, the second circuit board comprises a counter region in which a plurality of counters that count pulse signals from the plurality of pixels are arranged in a matrix, and a peripheral circuit region including a circuit that controls driving of the plurality of pixels and the plurality of counters, the pixel region includes a first region having a plurality of first pixels whose photoelectric conversion units are shielded from light and a second region having a plurality of second pixels whose photoelectric conversion units are not shielded from light, the counter region includes a plurality of first counters that count pulse signals from the plurality of first pixels, and a plurality of second counters that count pulse signals from the plurality of second pixels, at least part of the peripheral circuit region in the second circuit board is arranged in a region that overlaps with the first region of the first circuit board, and each unit is implemented by one or more processors, circuitry or a combination thereof.

According to the present invention, provided is an image capturing apparatus comprising: an image sensor in which a first circuit board and a second circuit board which is different from the first circuit board are stacked so as to overlap each other, wherein the first circuit board comprises a pixel region in which a plurality of pixels are arranged in a matrix, each pixel having a photoelectric conversion unit and a circuit that outputs a pulse signal indicative of incidence of photon in response to incidence of light on the photoelectric conversion unit, the second circuit board comprises a counter region in which a plurality of counters that count pulse signals from the plurality of pixels are arranged in a matrix, and a peripheral circuit region including a circuit that controls driving of the plurality of pixels and the plurality of counters, the pixel region includes a first region having a plurality of first pixels whose photoelectric conversion units are shielded from light and a second region having a plurality of second pixels whose photoelectric conversion units are not shielded from light, the counter region includes a plurality of first counters that count pulse signals from the plurality of first pixels, and a plurality of second counters that count pulse signals from the plurality of second pixels, and at least part of the peripheral circuit region in the second circuit board is arranged in a region that overlaps with the first region of the first circuit board; and a correction unit that corrects count values counted by the second counters using count values counted by the first counters, wherein each unit is implemented by one or more processors, circuitry or a combination thereof.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 3 is a plan view showing a configuration example of the image sensor according to the first embodiment;

FIG. 5 is a diagram illustrating an example of a circuit configuration of a pixel and a counting unit of an image sensor according to the first embodiment;

DESCRIPTION OF THE EMBODIMENTS

Figure 1:
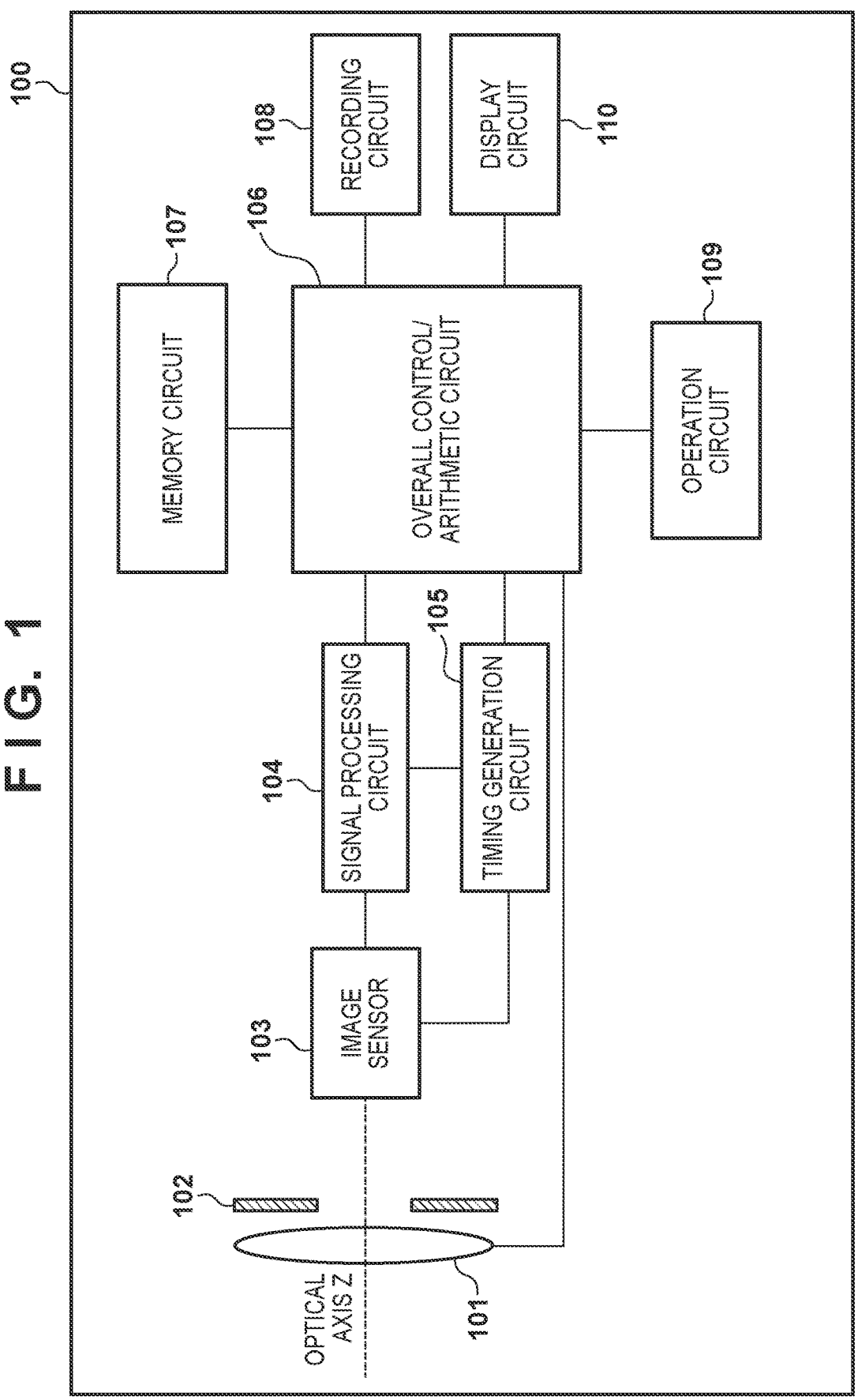
FIG. 1 is a block diagram showing a schematic configuration of an image capturing apparatus according to an embodiment of the present invention.

Hereinafter, embodiments will be described in detail with reference to the attached drawings. Note, the following embodiments are not intended to limit the scope of the claimed invention, and limitation is not made an invention that requires a combination of all features described in the embodiments. Two or more of the multiple features described in the embodiments may be combined as appropriate. Furthermore, the same reference numerals are given to the same or similar configurations, and redundant description thereof is omitted.

First Embodiment

FIG. 1 is a block diagram showing a schematic configuration of an image capturing apparatus 100 according to an embodiment of the present invention. In FIG. 1, the imaging optical system of the image capturing apparatus 100 includes an imaging lens 101 and a diaphragm 102. The light that has passed through the imaging lens 101 and the diaphragm 102 forms an image near the focal position of the imaging lens 101. Although the imaging lens 101 is illustrated as a single lens, it is actually composed of a lens group including a plurality of lenses.

An image sensor 103 has a function of capturing an image of a subject formed by the imaging lens 101 as a signal. A signal processing circuit 104 performs various corrections such as signal amplification and reference level adjustment, and data rearrangement on the signal output from the image sensor 103. Note that some signal processing functions such as reference level adjustment may be provided in the image sensor 103. A timing generation circuit 105 outputs a drive timing signal to the image sensor 103 and the signal processing circuit 104.

An overall control/arithmetic circuit 106 performs overall driving and control of the entire image capturing apparatus 100 including the image sensor 103 and the signal processing circuit 104. Further, the overall control/arithmetic circuit 106 performs predetermined image processing, defect correction, and the like on the image signal output from the signal processing circuit 104. A memory circuit 107 and a recording circuit 108 are a recording medium such as a non-volatile memory or a memory card that records and holds image signals output from the overall control/arithmetic circuit 106. An operation circuit 109 receives a signal from an operation member provided in the image capturing apparatus 100, and reflects the user's instruction to the overall control/arithmetic circuit 106. A display circuit 110 displays images after shooting, live view images, various setting screens, and so forth.

Figure 2:
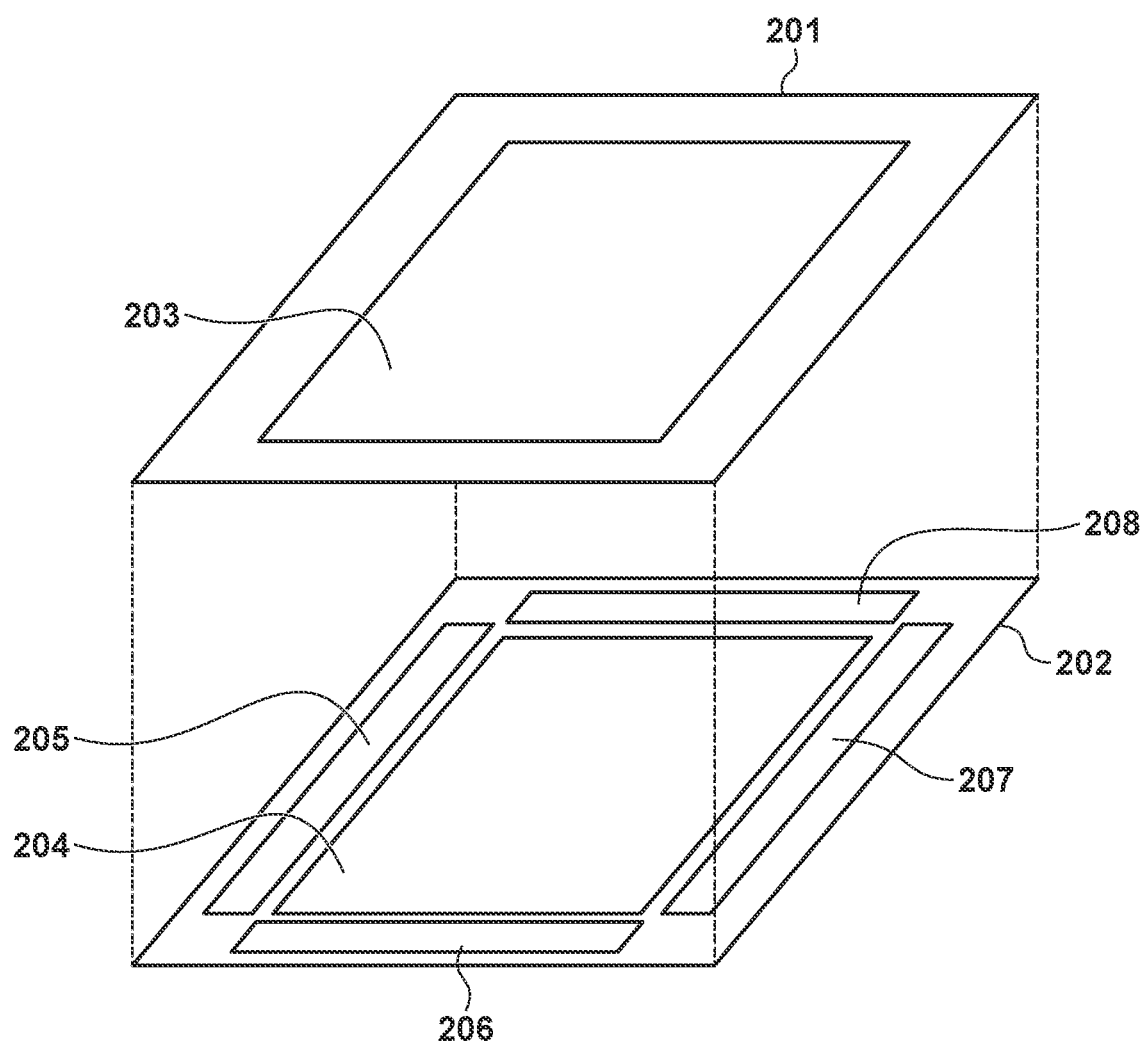
FIG. 2 is a schematic diagram illustrating a configuration example of an image sensor according to a first embodiment.

Next, a configuration of the image sensor 103 will be described with reference to FIGS. 2 and 3. FIGS. 2 and 3 are diagrams showing a configuration example of the image sensor 103 in the embodiment of the present invention.

In FIG. 2, the image sensor 103 has a structure in which a pixel region board 201 and a readout circuit board 202 are laminated. The wirings of these boards are electrically connected using silicon through electrodes or the like. The pixel region board 201 includes a pixel region 203, and the readout circuit board 202 includes a counting region 204 and peripheral circuit regions 205, 206, 207 and 208.

Next, each area constituting the image sensor 103 having the above configuration will be described in detail with reference to FIG. 3. A pixel region 203 on the pixel region board 201 is composed of an optical black (OB) region (a shaded region in FIG. 3) that is optically shielded from light and a light receiving region that receives an optical image of a subject. Here, the OB region is arranged in the periphery so as to surround the light receiving region.

In the OB region, a plurality of light-shielded pixels 301 (hereinafter, referred to as "OB pixels 301") are arranged in a matrix so as to surround the light receiving region, and in the light receiving region, a plurality of pixels 302 which are not shielded from light (hereinafter, referred to as "light-receiving pixels 302") are arranged in a matrix. The pixel signal read out from the OB pixel 301 arranged in the OB region is used to obtain a correction value for the clamp processing to a reference signal level.

In FIG. 3, the 24 light-receiving pixels 302 are illustrated in 4 rows and 6 columns, but actually, tens of millions of light-receiving pixels 302 are arranged. Then, correspondingly, there are a large number of OB pixels 301 arranged. Furthermore, it is preferable that a plurality of columns or a plurality of rows of the OB pixels 301, not one column or one row, are arranged in the periphery of the light receiving region, because a correction value can be obtained more accurately.

On the other hand, the readout circuit board 202 includes the counting region 204 and the peripheral circuit regions 205, 206, 207 and 208 as described above. In the counting region 204, OB pixel counting units 304 that count pulse signals emitted from the OB pixels 301 and light-receiving pixel counting units 305 that count pulse signals emitted from the light-receiving pixels 302 are arranged in a matrix. The OB pixel counting units 304 and the light-receiving pixel counting units 305 are connected to the OB pixels 301 and the light-receiving pixels 302 arranged at corresponding positions on the pixel region board 201, respectively.

Here, the corresponding positional relationship between the pixels and the counting units will be briefly described. For example, FIG. 3 illustrates the pixel region 203 including 8×6 pixels (OB pixels 301 and light-receiving pixels 302) and the counting regions 204 including 8×6 counting units (OB pixel counting units 304, light-receiving pixel counting units 305). The OB pixel 301 at the upper left corner is connected to the OB pixel counting unit 304 at the upper left corner. Similarly, the pixels and the counting unit at the corresponding positions are connected to each other. By connecting in this way, it is possible to configure the image sensor 103 without complicatedly laying the output lines from the pixel region 203 to the counting region 204.

Next, the peripheral circuit regions 205, 206, 207 and 208 will be described. The peripheral circuit regions 205, 206, 207 and 208 include a vertical selection circuit, a horizontal selection circuit, a timing generation circuit (hereinafter, TG), a digital signal output circuit, a control circuit, a digital signal processing circuit, and so forth. As an example, a configuration in which the peripheral circuit region 205 includes a vertical selection circuit and a TG, the peripheral circuit regions 206 and 208 each include a horizontal selection circuit, a digital signal processing circuit, and a control circuit, and the peripheral circuit region 207 includes a digital signal output circuit may be considered.

The TG sends signals to the vertical selection circuit, the horizontal selection circuit, the OB pixel counting unit 304 and the light-receiving pixel counting unit 305 in the counting region 204, the digital signal processing circuit, and the digital signal output circuit, to control the driving thereof. The OB pixel counting unit 304 and the light-receiving pixel counting unit 305 receive and count the pulse signal generated in the exposure period from each pixel (OB pixel 301, light-receiving pixel 302) under the control of the TG. Then, the obtained count values are sequentially output to the outside of the image sensor 103 from the digital signal output circuit via the digital signal processing circuit under the control of the vertical selection circuit and the horizontal selection circuit. Further, the TG and the control circuit also send signals to the pixel region board 201 to control the driving of the pixels.

Figure 4A:
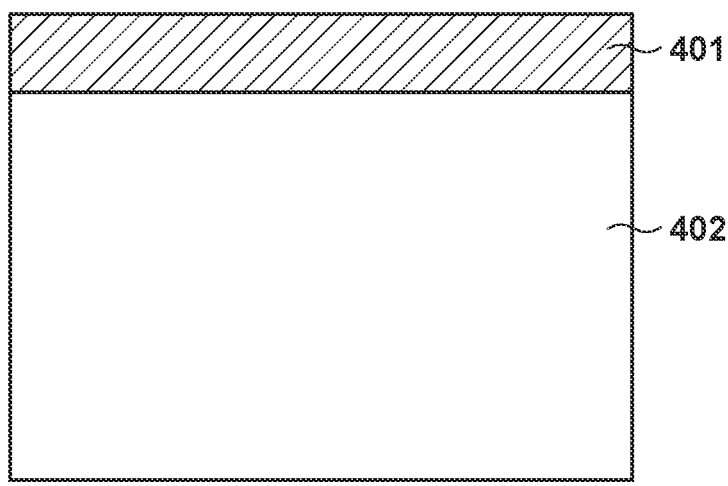
FIGS. 4A to 4C are plan views showing other examples of an arrangement of a pixel region according to the first embodiment.
Figure 4B:
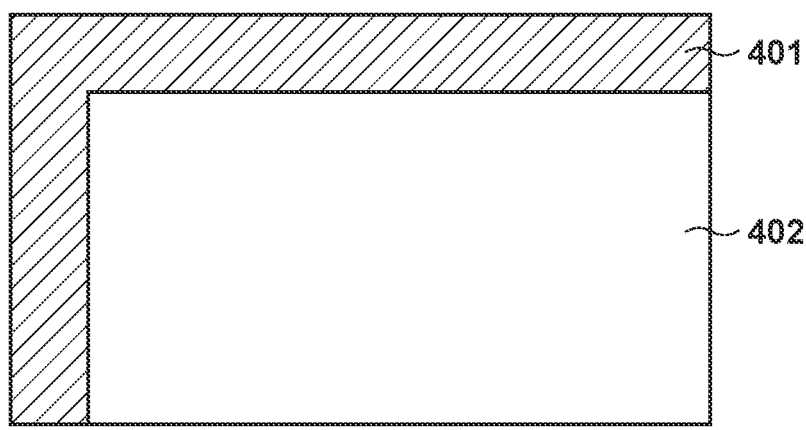
Figure 4C:
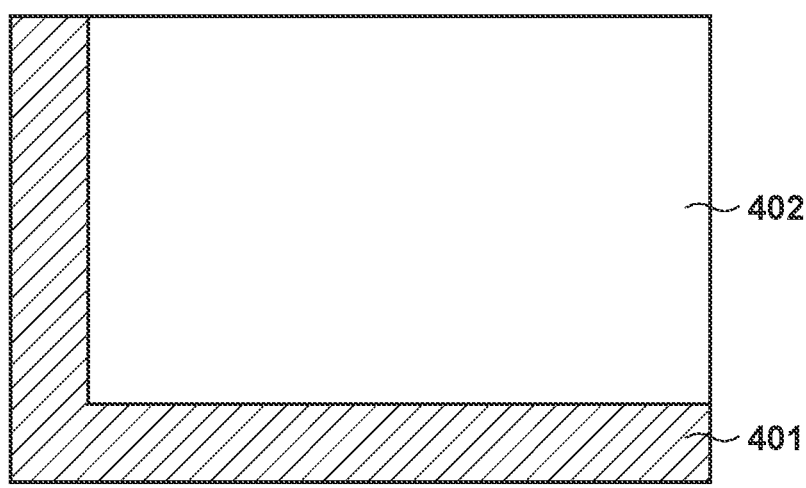

The arrangement of the OB region and the light receiving region in the pixel region 203 is not limited to that shown in FIG. 3. FIGS. 4A to 4C show other arrangement examples in the pixel region 203 of the image sensor 103. The arrangement may be the one as shown in FIG. 4A in which the OB region 401 is arranged above the light receiving region 402, the one as shown in FIG. 4B in which the OB region 401 is arranged at the upper and left portions, or the one as shown in FIG. 4C in which the OB region 401 is arranged at the lower and left portions. As described above, the present invention is not limited by the arrangement of the OB region and the light receiving region in the pixel region 203.

Here, the surface area of the chip of the image sensor 103 is considered. The surface area of the pixel region board 201 is almost determined by the surface area of the pixel region 203. On the other hand, in the readout circuit board 202, there are peripheral circuit regions 205, 206, 207 and 208 in addition to the counting region 204 in which the counting units 304 and 305 are arranged so as to correspond to the pixels in the pixel region 203. Therefore, there is a problem that the surface area of the readout circuit board 202 becomes large. Since the size of the surface area of the chip affects the cost of the image sensor, it is desirable that the surface area of the chip does not increase much.

Accordingly, in the first embodiment, the area of the OB pixel counting unit 304 is made smaller than that of the light-receiving pixel counting unit 305. By reducing the area of the OB pixel counting unit 304, the area produced by reducing the area of the OB pixel counting unit 304 can be used as the peripheral circuit region, and as a result, an increase in the surface area of the image sensor 103 can be suppressed. A method for reducing the area of the OB pixel counting unit 304 will be described below.

FIG. 5 is a diagram illustrating an example of a circuit configuration of a pixel and a counting unit of the image sensor 103 according to the first embodiment. Although only one pixel and one counting unit are shown in FIG. 5, the OB pixel 301 and the light-receiving pixel 302 have the same circuit configuration, and the OB pixel counting unit 304 and the light-receiving pixel counting unit 305 have the same circuit configuration. Therefore, in FIG. 5, they are referred to as a "pixel 500" and a "counting unit 505".

The pixel 500 formed on the pixel region board 201 is connected to the counting unit 505 formed on the readout circuit board 202 via a silicon through electrode 506. The pixel 500 includes a photodiode (hereinafter, PD) 501 (photoelectric conversion unit), a quenching resistor 502, an inverting buffer 503, and a pulse shaping circuit 504 that shapes a pulse signal.

The PD 501 is an avalanche photodiode, to which a reverse bias voltage Vbias higher than the breakdown voltage is applied via the quenching resistor 502, and operates in Geiger mode. As a result, when a photon is incident on the PD 501, an avalanche multiplication phenomenon is caused and an avalanche current is generated. The quenching resistor 502 is a resistance element for stopping the avalanche multiplication phenomenon of the PD 501. As the quenching resistor 502, the resistance component of the transistor may be used. When an avalanche current is generated in the PD 501 due to the avalanche multiplication phenomenon, a voltage drop occurs in the quenching resistor 502, and the reverse bias voltage applied to the PD 501 drops. When the reverse bias voltage drops to the breakdown voltage, the avalanche multiplication phenomenon stops. As a result, the avalanche current stops flowing, and the PD 501 returns to the state in which the reverse bias voltage Vbias is applied again.

The inverting buffer 503 outputs a pulse signal which represents the voltage change occurred in the quenching resistor 502. In this way, when a photon is incident on the PD 501, the inverting buffer 503 outputs one pulse signal. Here, "Spd" shown in FIG. 5 indicates a waveform generated by the PD 501 and the quenching resistor 502. "Spd_inv" indicates a pulse signal output from the inverting buffer 503. While the voltage of the signal Spd is lower than the threshold value Vth, the pulse signal Spd_inv becomes Hi.

Then, the pulse signal Spd_inv output from the inverting buffer 503 is input to the pulse shaping circuit 504. The pulse shaping circuit 504 performs edge detection on the input pulse signal Spd_inv, generates and outputs a pulse having a narrow pulse width, that is, a pulse having a short Hi period ("PLS" in FIG. 5). The pulse PLS output from the pulse shaping circuit 504 is input to the counting unit 505 formed on the readout circuit board 202 via the silicon through electrode 506, and the counting unit 505 counts the number of pulses.

Figure 6:
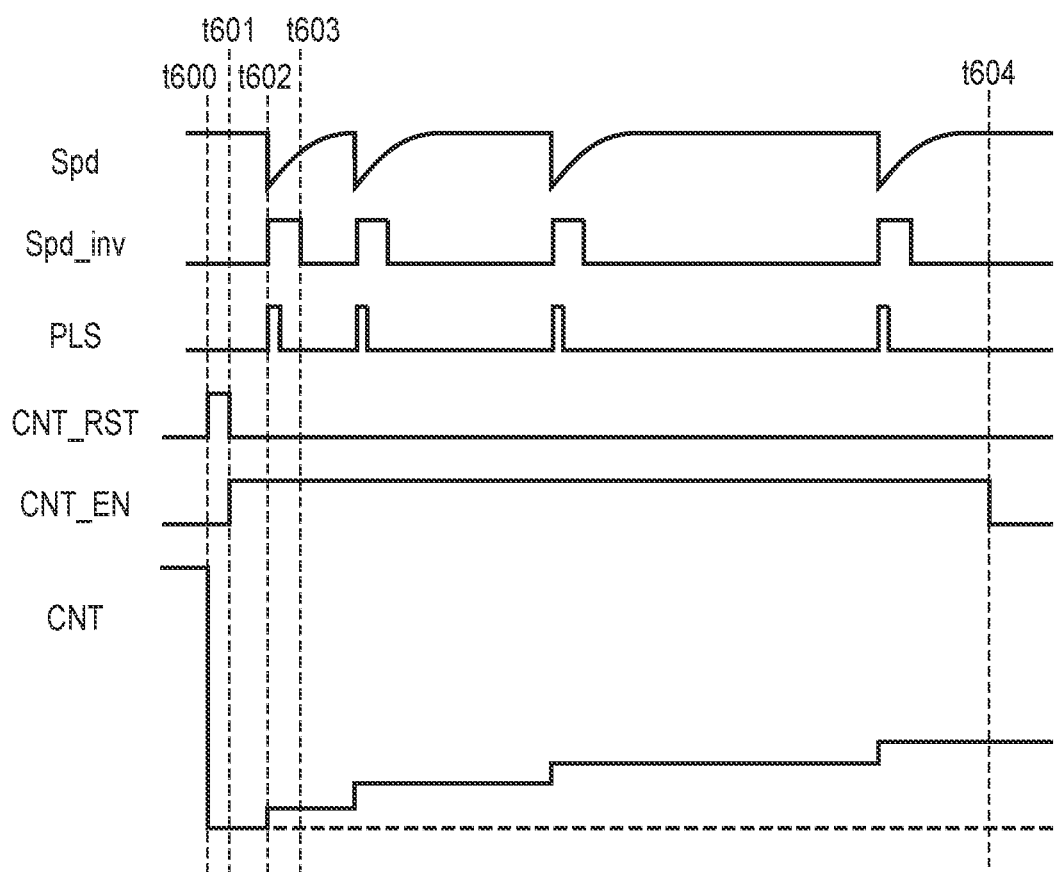
FIG. 6 is a timing chart showing an example of a photon counting operation according to the first embodiment.

Next, the photon counting operation in the OB pixel 301 and the light-receiving pixel 302 of the image sensor 103 will be described. FIG. 6 is a timing chart showing an example of the photon counting operation by the pixel 500 and counting unit 505 shown in FIG. 5. "Spd" in FIG. 6 indicates the waveform of the signal generated by the PD 501 and the quenching resistor 502. "Spd_inv" indicates a pulse signal output from the inverting buffer 503, and the pulse signal Spd_inv becomes Hi while the voltage of the signal Spd is lower than the threshold value Vth. "PLS" indicates a pulse signal shaped and output by the pulse shaping circuit 504.

"CNT_RST" and "CNT_EN" represent drive signals sent from a control circuit (not shown) included in the peripheral circuit regions 205, 206, 207 and 208, and control the counting unit 505. By controlling the drive signal CNT_RST to Hi, the counter of the counting unit 505 is reset. Further, the counting unit 505 counts the number of pulses only during the period when the drive signal CNT_EN is Hi. In this way, an exposure period can be controlled. "CNT" represents a count value counted by the counting unit 505.

Prior to the start of exposure, the count value of the counting unit 505 is reset by setting the drive signal CNT_RST to Hi and Lo at times t600 and t601, respectively.

At time t601, the drive signal CNT_EN is set to Hi to enable the counting unit 505 to count pulses (start of shooting).

At time t602, photons are incident on the PD 501, avalanche multiplication occurs, and the potential of the signal Spd changes. Since the signal Spd is output via the quenching resistor 502, it takes time for the signal Spd to reach a constant potential again. In response to the voltage change of the signal Spd, the inverting buffer 503 generates the pulse signal Spd_inv, and the pulse shaping circuit 504 detects the edge of the pulse signal Spd_inv to generate a pulse signal PLS having a short Hi period. The pulse signal PLS that becomes Hi at time t602 is input to the counting unit 505 via the through electrode 506, and the count value CNT becomes 1.

After time t603, until the drive signal CNT_EN becomes Lo at time t604 (end of shooting), each time a photon is incident on the PD 501, a pulse signal PLS is generated and counted by the counting unit 505. That is, the count value counted by the counting unit 505 becomes a value corresponding to the number of incident photons, and this becomes the pixel signal value of the pixel 500.

After the image shooting ends at time t604, the count value counted by the counting unit 505 of each pixel 500 is output to the digital signal processing circuit then to the digital signal output circuit by the control of the vertical selection circuit and the horizontal selection circuit, and output to the outside of the image sensor 103.

The image sensor 103 of the present embodiment adapts a photon counting method, and the operation when the photons are incident has been described with reference to FIGS. 5 and 6. However, in addition to the incidence of photons, there are cases in which dark current or the like causes an avalanche multiplication phenomenon, and as a result, the count value increases. The count value resulting from the dark current per unit time is called Dark Count Rate (hereinafter, DCR). DCR increases under high temperature environment and long-term accumulation, and is added as an offset to the image signal. As a result, the captured image deteriorates, and thus, it is desirable to correct the influence of DCR.

The image sensor 103 of the present embodiment has the OB pixels 301, which are shielded from light, around the light-receiving pixels 302, and a black reference signal can be obtained by performing arithmetic processing using the signal levels of the OB pixels 301 as a reference. Here, the maximum count value of the OB pixels 301 obtained during the exposure period is much smaller than the maximum count value of the light-receiving pixels 302 because no photon is incident. If the dark current component occupies a count value that is close to the maximum count value assumed for an image signal (for example, 4095 counts in 12 bits) under a shooting condition where the count value by DCR is very large, it is inappropriate to use the obtained signal as an image signal. Therefore, in such a case, it is necessary to review the shooting conditions.

As described above, the bit number of the counters of the OB pixel counting units 304 can be made smaller than the bit number of the counters of the light-receiving pixel counting units 305. Since the surface area of the counting unit largely depends on the number of bits of the counter, each OB pixel counting unit 304 having a small number of bits of the counter can be configured with the surface area smaller than that of the light-receiving pixel counting unit 305.

If the OB pixels 301 are arranged in multiple rows and multiple columns, since the surface area of the OB pixel counting unit 304 is smaller than that of the surface area of the corresponding OB pixel 301, the positional relationship between each pair of the OB pixel 301 and the OB pixel counting unit 304 is shifted, and the wiring length of the output line from the OB pixel 301 to the OB pixel counting unit 304 variates depends on the pair. In the conventional image sensor that converts incident light into a voltage value, there is an influence of the difference in wiring length on the signal such that the output value fluctuates due to wiring resistance and parasitic capacitance. By contrast, the image sensor 103 of the present embodiment has a merit that it is not affected by the wiring length of the output line because it adapts a method of counting the number of incident photons.

Figure 7:
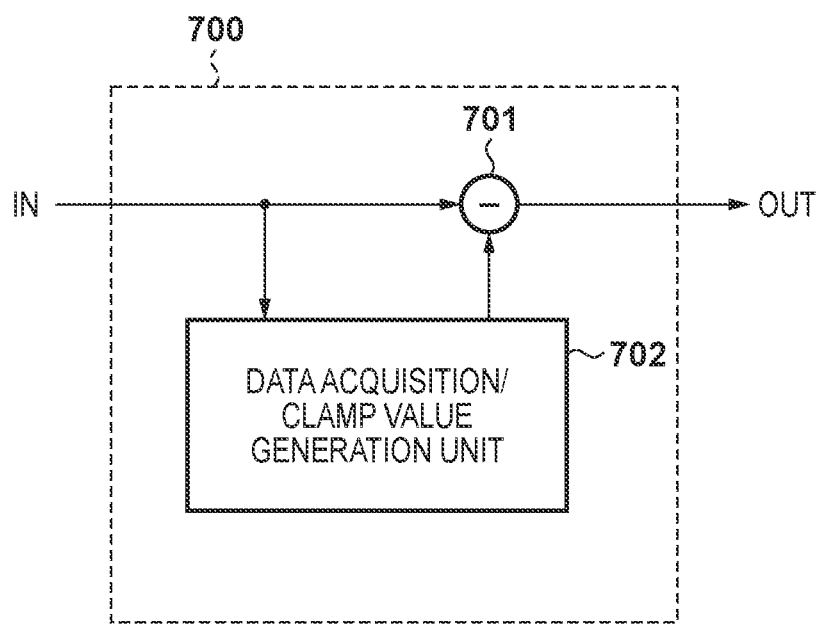
FIG. 7 is a view for explaining clamp processing of a signal processing circuit according to the first embodiment.

A black reference signal obtained by using signals from the OB pixels 301 is used for clamp processing in the digital signal processing circuit or the like arranged in the peripheral circuit regions (for example, peripheral circuit regions 206 and 208). FIG. 7 is a diagram for explaining the clamp processing in the digital signal processing circuit 700. The signals (count values) sent from the counting units (OB pixel counting units 304, light-receiving pixel counting units 305) are input from an IN terminal shown in FIG. 7. When a signal from the OB pixel 301 is input in response to the control signal from the TG (not shown), it is sent to a data acquisition/clamp value generation unit 702. Then, in the data acquisition/clamp value generation unit 702, signals from the OB region are averaged to calculate a black reference signal.

For example, the signals of the OB pixels 301 are first sent to the digital signal processing circuit 700, the signals of all the OB pixels 301 are averaged, the black reference signal is calculated, and a clamp value is calculated based on the black reference signal. Then, when a pixel signal (count value) of the light-receiving pixel 302 is read out and input to the digital signal processing circuit 700, a subtraction circuit 701 subtracts the clamp value. In this way, it is possible to remove the deviation of the black level due to the influence of the dark current or the like and match the black level of the pixel signal with the black reference signal. The clamp processing may be performed by the signal processing circuit 104 included in the image capturing apparatus.

According to the first embodiment as described above, the image capturing apparatus capable of detecting a single photon is configured such that the number of bits of the counter of the OB pixel counting unit is designed smaller than the number of bits of the counter of the light-receiving pixel counting unit. By doing so, the surface area of the OB pixel counting unit is reduced. Then, a surface area corresponding to the reduced surface area of the light receiving pixel counting units is allocated to the peripheral circuit region, that is, at least part of the peripheral circuit region in the readout circuit board 202 is arranged at a position overlapping the region where the OB pixels 301 of the pixel region board 201 are arranged. As a result, it is possible to suppress an increase in the surface area of the image sensor. Also, by disposing OB pixels, it becomes possible to perform appropriate correction using the black reference signals.

Second Embodiment

Next, a second embodiment of the present invention will be described. In the second embodiment, a plurality of OB pixels share one OB pixel counting unit, thereby further reducing the surface area of the counting unit region. Note that the overall structure of the image capturing apparatus 100 is the same as that shown in FIG. 1, and the description thereof is omitted here.

Figure 8:
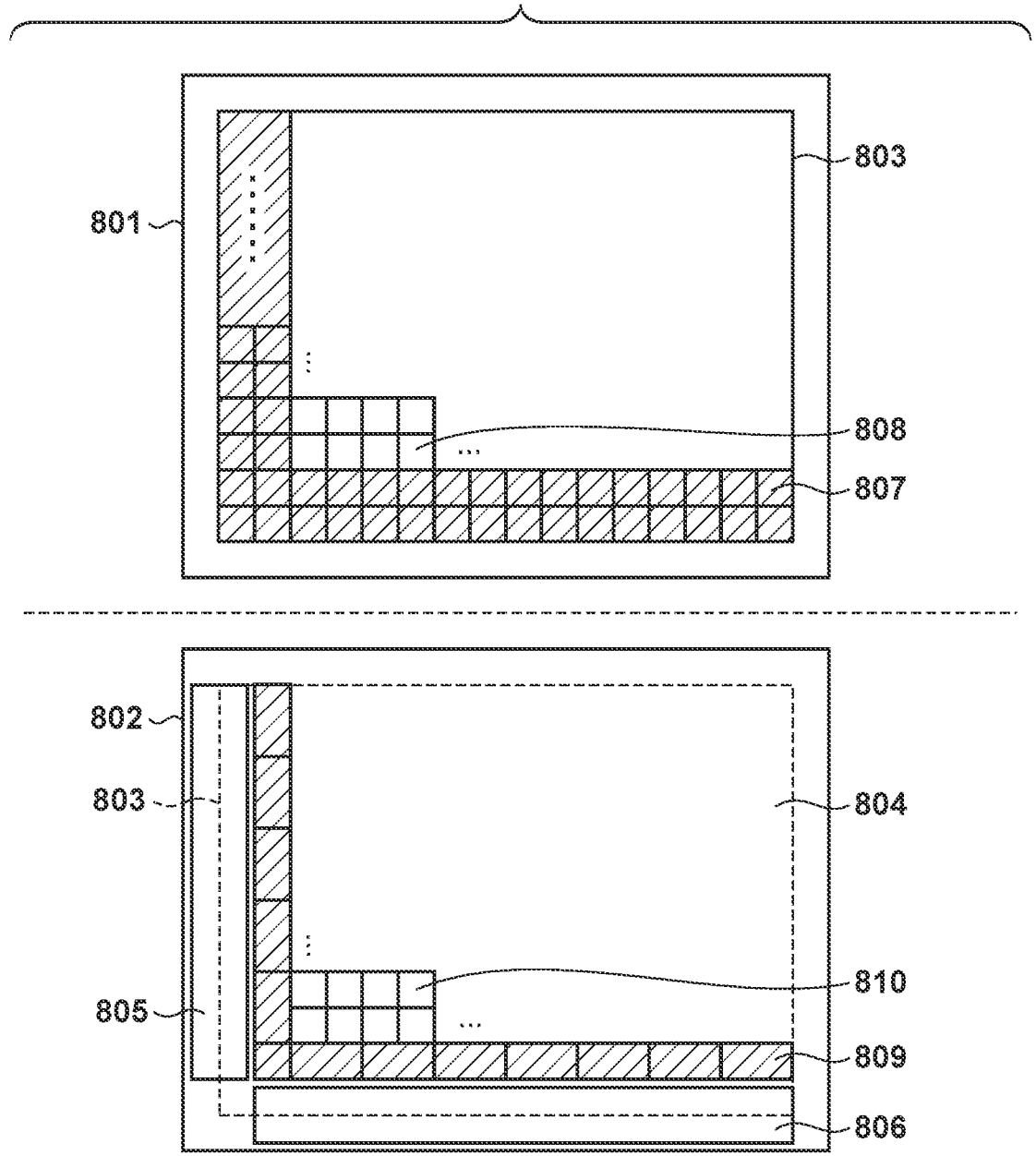
FIG. 8 is a plan view showing a configuration example of an image sensor according to a second embodiment.

FIG. 8 is a plan view showing a configuration example of the image sensor 103 in the second embodiment. Similar to the image sensor 103 in the first embodiment, it has a configuration in which a pixel region board 801 and a readout circuit board 802 are laminated. A pixel region 803 on the pixel region board 801 is composed of an optical black (OB) region (a shaded region in FIG. 8) that is optically shielded from light and a light receiving region that receives an optical image of a subject. Here, the OB region is arranged in the lower part and the left part of the light receiving region.

In the OB region, a plurality of light-shielded pixels 807 (hereinafter, referred to as "OB pixels 807") are arranged in a matrix next to the lower and left sides of the light receiving region, and in the light receiving region, a plurality of pixels 808 which are not shielded from light (hereinafter, referred to as "light-receiving pixels 808") are arranged in a matrix. The pixel signal read out from the OB pixel 807 arranged in the OB region is used to obtain a correction value for the clamp processing to a reference signal level.

On the other hand, the readout circuit board 802 includes a counting region 804 and peripheral circuit regions 805 and 806. In the counting region 804, OB pixel counting units 809 that count pulse signals emitted from the OB pixels 807 and light-receiving pixel counting units 810 that count pulse signals emitted from the light-receiving pixels 808 are arranged in a matrix. The OB pixel counting units 809 and the light-receiving pixel counting units 810 are connected to the OB pixels 807 and the light-receiving pixels 808 arranged at corresponding positions on the pixel region board 801, respectively.

However, here, a plurality of OB pixels 807 share one OB pixel counting unit 809, that is, one OB pixel counting unit 809 counts the pulses output from the plurality of OB pixels 807. Note that, in FIG. 8, each OB pixel counting unit 809 is described having a configuration that counts the pulses from four OB pixels 807, but the present invention is not limited to this.

In this way, since a plurality of OB pixels 807 share one OB pixel counting unit 809, the surface area of the OB pixel counting units 809 can be reduced as a whole. As described in the first embodiment, the surface area of the counting unit depends on the number of bits of the counter. For example, assume that the number of bits of the counter of the light-receiving pixel counting units 810 that counts the pulses output from the light-receiving pixels 808 is 12 bits, and the maximum number of pulses output from one OB pixel 807 is 10 bits.

When one OB pixel counting unit 809 is shared by four pixels as shown in FIG. 8, the number of bits of the counter required for the OB pixel counting unit 809 is 10 bits×4=12 bits in total for four pixels. Considering the area of the counting unit, it can be significantly reduced as compared with the case where each of the four pixels has a counter of 10 bits as in the first embodiment.

In addition, the peripheral circuit regions 805 and 806 are arranged so as to be adjacent to the region where the OB pixel counting units 809 are arranged, and in this region, a vertical selection circuit, a horizontal selection circuit, a timing generation circuit (TG), a digital signal output circuit, a control circuit, a digital signal processing circuit, and so forth, are provided. Note that the arrangement of the peripheral circuit regions 805 and 806 is not limited to this, and may be arranged at upper, lower, right and left portions around the counting region 804 as shown in FIG. 3.

Figure 9:
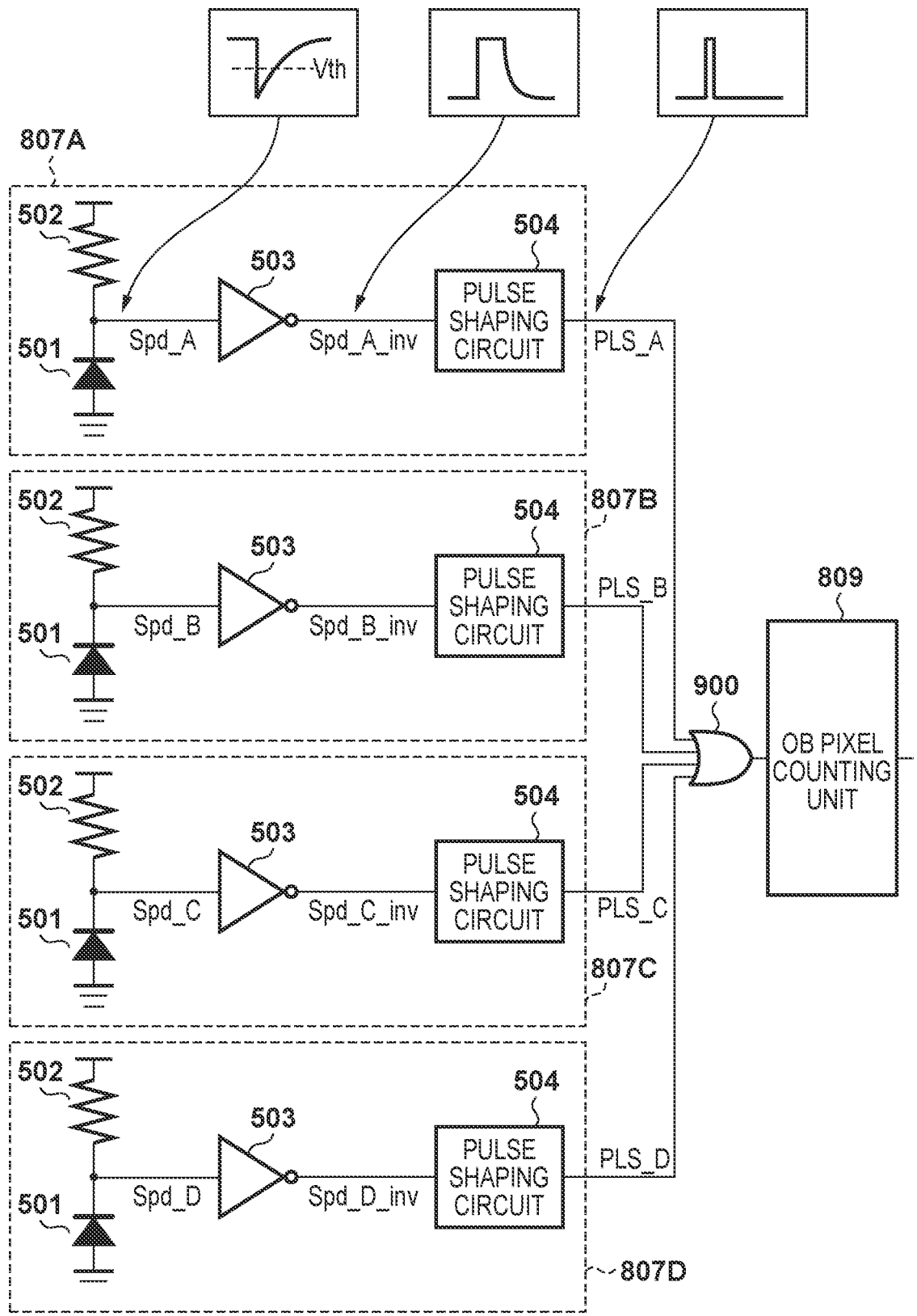
FIG. 9 is a diagram illustrating an example of a circuit configuration of an OB pixel and an OB pixel counting unit of the image sensor according to the second embodiment.

Next, the circuit configuration according to the second embodiment when four OB pixels 807 share one OB pixel counting unit 809 will be described with reference to FIG. 9. In FIG. 9, four OB pixels 807A, 807B, 807C, and 807D are connected to an OR circuit 900, and the number of pulses output from each pixel via the OR circuit 900 is counted by the OB pixel counting unit 809.

Note that the OR circuit 900 may be arranged on either side of the pixel region board 201 and the readout circuit board 202. Further, the internal configuration of each of the four OB pixels 807A, 807B, 807C, 807D is the same as the configuration of the pixel 500 shown in FIG. 5. Accordingly, the same reference numerals are given and the description thereof is omitted.

Next, a photon counting operation of counting the number of photons incident on the four OB pixels 807A, 807B, 807C, 807D shown in FIG. 9 will be described with reference to the timing chart of FIG. 10.

Figure 10:
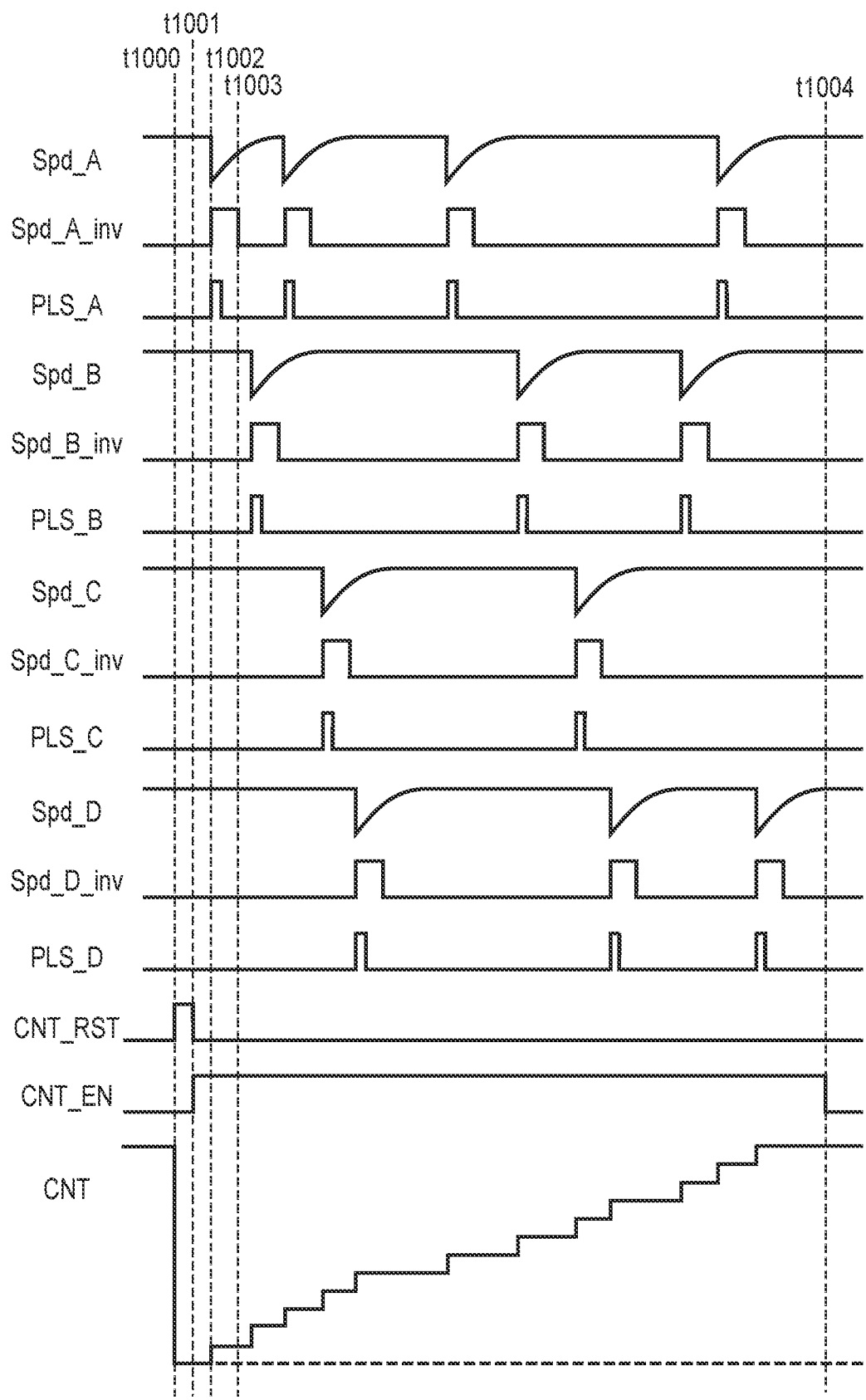
FIG. 10 is a timing chart showing an example of a photon counting operation according to the second embodiment.

"Spd_A" to "Spd_D" in FIG. 10 represent waveforms of signals generated by the PDs 501 and the quenching resistors 502 of the OB pixels 807A to 807D. Further, "Spd_A_inv" to "Spd_D_inv" indicate pulse signals output from the inverting buffers 503 of the OB pixels 807A to 807D.

While the voltage of the signals Spd_A to Spd_D drops below the threshold value Vth, the pulse signals Spd_A_inv to Spd_D_inv become Hi. "PLS_A" to "PLS_D" represent pulse signals shaped and output by the pulse shaping circuits 504 of the OB pixels 807A to 807D, respectively. The above-mentioned signals correspond to the signals shown in FIG. 9.

"CNT_RST" and "CNT_EN" represent drive signals sent from a control circuit (not shown) included in the peripheral circuit regions 805 and 806, and control the OB pixel counting unit 809. By controlling the drive signal CNT_RST to Hi, the counter of the OB pixel counting unit 809 is reset. Further, the OB pixel counting unit 809 counts the number of pulses only during the period when the drive signal CNT_EN is Hi. In this way, an exposure period can be controlled. "CNT" represents a count value of the OB pixel counting unit 809.

Prior to the start of exposure, the count value of the OB pixel counting unit 809 is reset by setting the drive signal CNT_RST to Hi and Lo at times t1000 and t1001, respectively.

At time t1001, the drive signal CNT_EN is set to Hi to enable the OB pixel counting unit 809 to count pulses (start of shooting).

At time t1002, avalanche multiplication occurs in the PD 501 of the OB pixel 807 due to the influence of dark current or the like, and the potential of the signal Spd_A changes. Since the signal Spd_A is output via the quenching resistor 502, it takes time for the signal Spd_A to reach a constant potential again. In response to the voltage change of the signal Spd_A, the inverting buffer 503 generates the pulse signal Spd_A_inv, and the pulse shaping circuit 504 detects the edge of the pulse signal Spd_A_inv to generate a pulse signal PLS_A having a short Hi period. The pulse signal PLS_A that becomes Hi at time t1002 is input to the OB pixel counting unit 809 via the OR circuit 900, and the count value CNT becomes 1.

Similar to the OB pixel 807A, when avalanche multiplication occurs in the PDs 501 of the OB pixels 807B to 807D due to the influence of dark current, the pulse signals PLS_B to PLS_D generated in response to the avalanche multiplication are transmitted via the OR circuit 900 to the OB pixel counting unit 809, and the count value CNT is counted up.

After time t1003, until the drive signal CNT_EN becomes Lo at time t1004 (end of shooting), each pulse signal generated in response to the occurrence of the avalanche multiplication in the PDs 501 of the OB pixels 807A to 807D sharing the OB pixel counting unit 809 is counted by the OB pixel counting unit 809. That is, the count value counted by the OB pixel counting unit 809 is the sum of the count values of the four OB pixels 807A to 807D.

After the image shooting ends at time t1004, the count value counted by each OB pixel counting unit 809 is output to the digital signal processing circuit then to the digital signal output circuit by the control of the vertical selection circuit and the horizontal selection circuit, and output to the outside of the image sensor 103.

The black reference signals obtained from the OB pixel counting units 809 are used for clamp processing in a digital signal processing circuit or the like arranged in the peripheral circuit region, as in the first embodiment. Although the clamp processing is similar to that described in the first embodiment, the calculation may be performed while considering that each black reference signal is the sum of the signal values of four pixels.

According to the second embodiment as described above, the surface area of the counting unit can be made smaller than that of the first embodiment, and a larger area can be used as the peripheral circuit region, which can further suppress an increases in the surface area of the image sensor.

Modification

Next, a modification of the second embodiment will be described. In the second embodiment, a configuration has been described in which a plurality of OB pixels share one OB pixel counting unit. Avalanche multiplication that occurs in the PDs of the OB pixels is mainly due to the dark current, and it is highly possible that avalanche multiplication occurs in the OB pixels at about the same time. In that case, a plurality of pulse signals are input to the OR circuit 900 simultaneously and output as one pulse signal. As a result, the problem that the number of pulses is not counted correctly is assumed. Therefore, a method for correctly counting the number of pulses even when avalanche multiplication occurs at the same time will be explained below.

Figure 11:
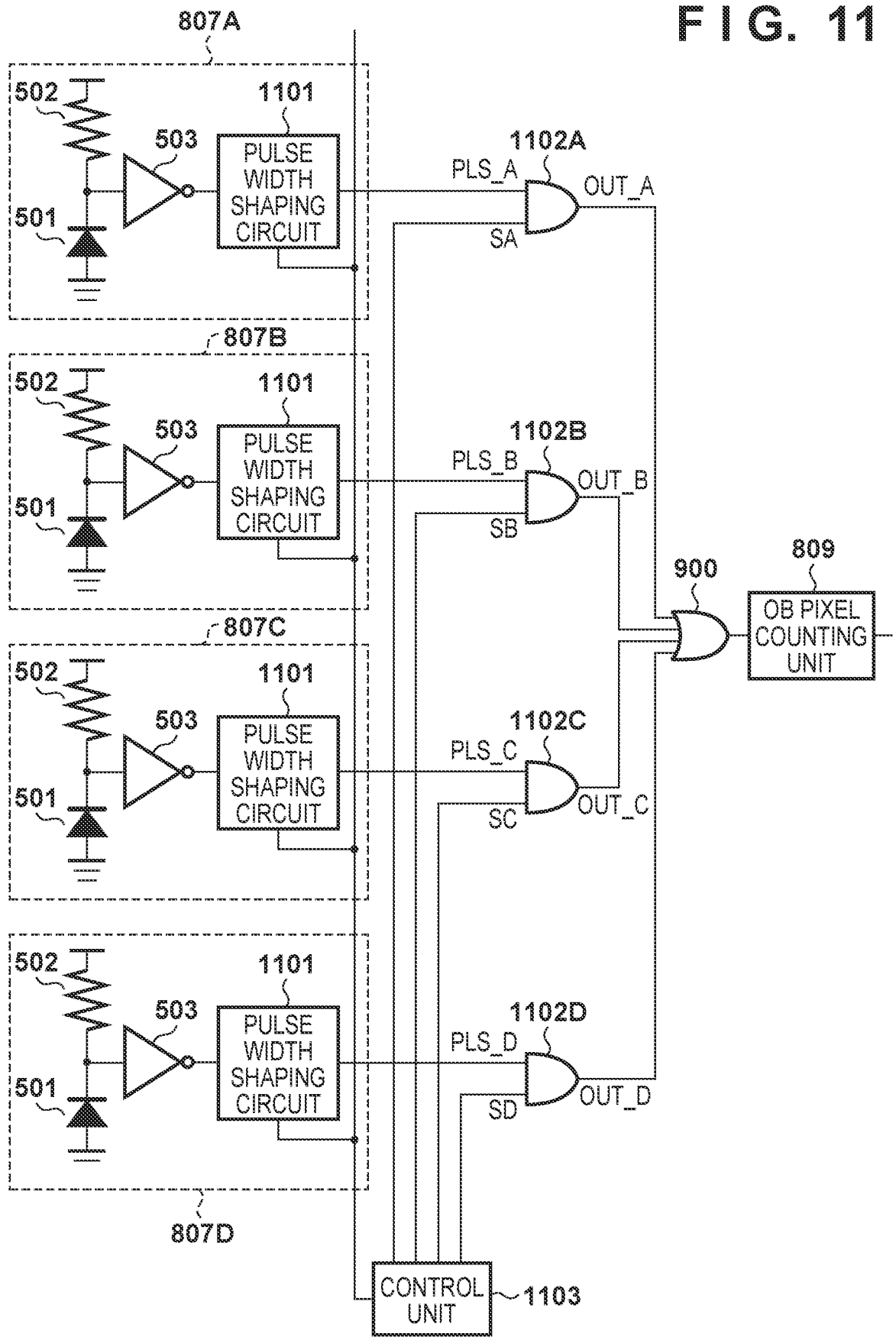
FIG. 11 is a diagram illustrating an example of a circuit configuration of an OB pixel and an OB pixel counting unit of an image sensor according to a modification of the second embodiment.

FIG. 11 is a diagram showing a circuit configuration of the OB pixels 807 and the OB pixel counting unit 809 in the present modification, which is used instead of the configuration shown in FIG. 9. Similar to the second embodiment, a plurality of OB pixels 807A, 807B, 807C and 807D are connected to the OB pixel counting unit 809 via the OR circuit 900. On the other hand, this modification is different in that each of the OB pixels 807A to 807D includes a pulse width shaping circuit 1101 instead of the pulse shaping circuit 504, and AND circuits 1102A, 1102B, 1102C, and 1102D are added.

The pulse width shaping circuit 1101 receives the pulse signal output from the inverting buffer 503, detects an edge, and outputs a pulse signal having a long Hi period according to the control of a control unit 1103. The pulse width depends on the number of OB pixels sharing the OB pixel counting unit 809, and is made longer as the number of OB pixels that share the OB pixel counting unit 809 increases. The method of determining the pulse width will be described later.

The pulse signals PLS_A to PLS_D output from the pulse width shaping circuit 1101 of the OB pixels 807A to 807D are input to the OR circuit 900 via the AND circuits 1102A to 1102D. A control signal from the control unit 1103 is input to the other terminals of the AND circuits 1102A to 1102D. The control signal input to the AND circuits 1102A to 1102D controls the sampling timing of the pulse signals PLS_A to PLS_D output from the OB pixels 807A to 807D.

By sending control signals SA to SD that become Hi at different timings to the AND circuits 1102A to 1102D, even if the pulse signals PLS_A to PLS_D simultaneously become Hi, pulses that become Hi at different timings are output from the AND circuits 1102A to 1102D. As a result, the pulse signals PLS_A to PLS_D that have simultaneously become Hi can be separated and counted.

As the control signals SA to SD from the control unit 1103, for example, they are shifted by 1 CLK each and repeatedly sent. On the other hand, a control signal is sent to the pulse width shaping circuit 1101 so that the pulse width becomes the width corresponding to the CLK width×the number of the OB pixels 807 that shares the OB pixel counting unit 809. In a case where four OB pixels 807A to 807D share one OB pixel counting unit 809 as shown in FIG. 11, a pulse signal is controlled to have a width four times as large as one CLK width. The signals output from the AND circuits 1102A to 1102D are counted by the OB pixel counting unit 809 via the OR circuit 900.

Figure 12:
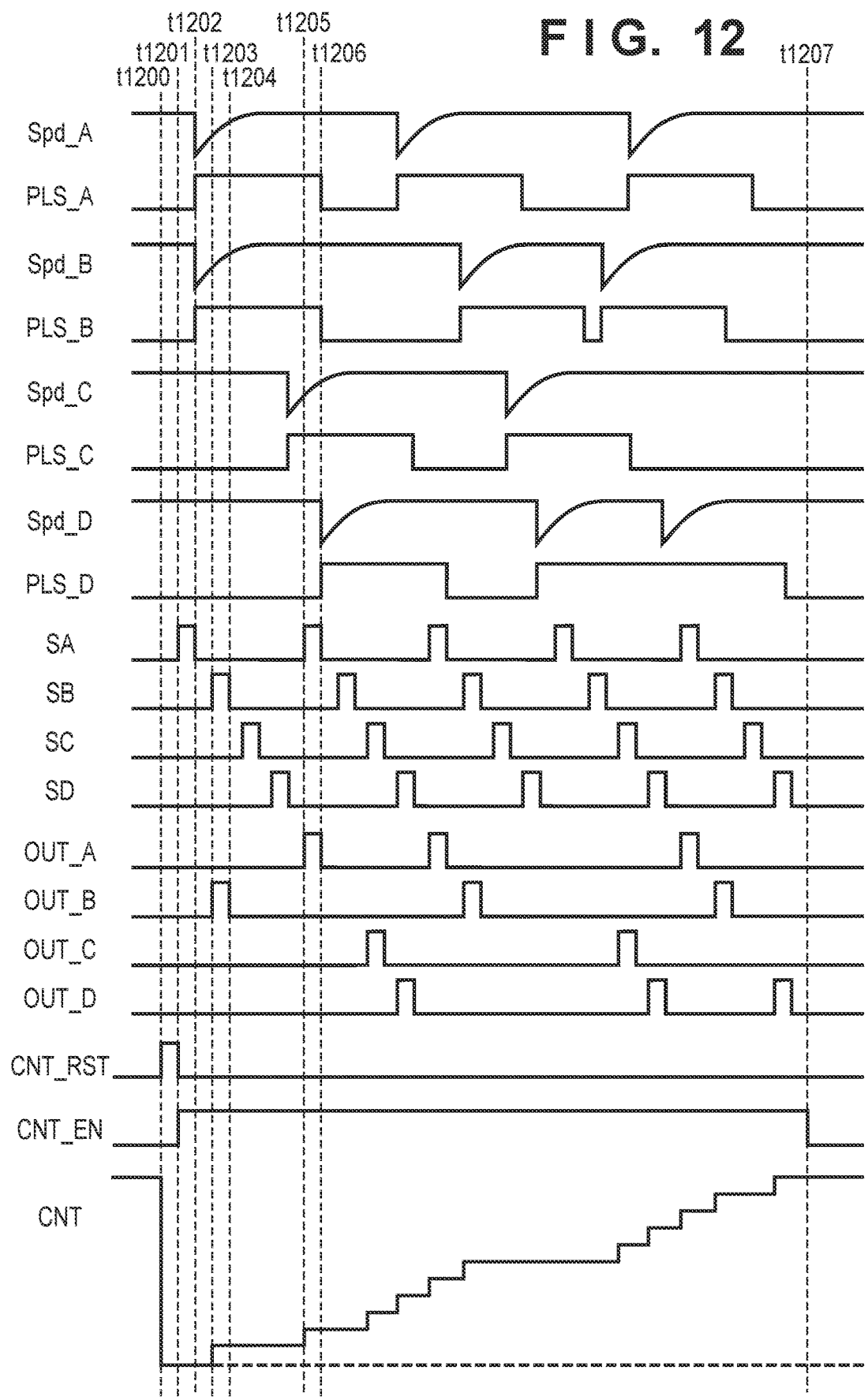
FIG. 12 is a timing chart showing an example of a photon counting operation according to a modification of the second embodiment.

Next, the photon counting operation of the photons incident on the OB pixels of the image sensor 103 in the modification of the second embodiment will be described. FIG. 12 is a timing chart showing an example of the photon counting operation of photons incident on the OB pixels 807A to 807D shown in FIG. 11. "Spd_A" to "Spd_D", "CNT_RST", "CNT_EN", and "CNT" in FIG. 12 are the same as those described in FIG. 10, and thus the description thereof is omitted here.

"PLS_A" to "PLS_B" indicate pulse signals shaped and output by the pulse width shaping circuit 1101 of each OB pixels 807A to 807D. "SA" to "SD" are control signals sent from the control unit 1103 to control the sampling timing, and become Hi at different timings. Further, "OUT_A" to "OUT_D" are signals output from the AND circuits 1102A to 1102D.

Prior to the start of exposure, the drive signal CNT_RST is set to Hi and Lo at times t1200 and t1201, respectively, and the count value of the OB pixel counting unit 809 is reset.

At time t1201, the drive signal CNT_EN is set to Hi, thereby the OB pixel counting unit 809 becomes ready to count pulses (start shooting).

At time t1202, avalanche multiplication occurs in PDs 501 of OB pixels 807A and 807B due to the effect of dark current, and the potentials of signals Spd_A and Spd_B change. Since the signals Spd_A and Spd_B are output via the quenching resistors 502, it takes time for the signals Spd_A and Spd_B to become a constant potential again. In response to the voltage changes of the signals Spd_A and Spd_B, the inverting buffer 503 generates pulse signals Spd_A_inv and Spd_B inv.

Then, the pulse width shaping circuit 1101 detects an edge, and the control unit 1103 controls to generate a pulse signal having a long Hi period (time t1202 to t1206). This length is equivalent to four CLK widths, which is equivalent to a cycle in which the control signals SA, SB, SC and SD become Hi once. Further, it is desirable that this length be within the time (within the dead time) since avalanche multiplication occurs in the PD 501 until the potential of the PD 501 becomes a predetermined potential again.

From time t1203 to t1204, the control signal SB becomes Hi, the output signal OUT_B of the AND circuit 1102B becomes Hi and is input to the OB pixel counting unit 809 via the OR circuit 900, and the count value CNT becomes 1, thereby the pulse from the OB pixel 807B is counted.

On the other hand, the pulse due to the avalanche multiplication generated in the PD 501 of the pixel 807A is counted by the OB pixel counting unit 809 at the timing from time t1205 to t1206 when the control signal SA becomes Hi and the output signal OUT_A becomes Hi. After that, until CNT_EN becomes Lo at time t1207 (end of shooting), each time avalanche multiplication occurs in PD

501s of OB pixels 807A to 807D sharing the OB pixel counting unit 809, a pulse signal is generated and counted by the OB pixel counting unit 809.

As described above, by sending a signal that controls the sampling timing from the control unit 1103, selecting a pulse signal based on the signal, and inputting a shaped signal to the OB pixel counting unit 809, in a case where avalanche multiplication simultaneously occurs in a plurality of pixels, it is possible to separate the events and count each event.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-127884, filed on Jul. 9, 2019 which is hereby incorporated by reference herein in its entirety.

What is claimed is:

1. An image sensor in which a first circuit board and a second circuit board which is different from the first circuit board are stacked so as to overlap each other, wherein
   the first circuit board comprises a pixel region in which a plurality of pixels are arranged in a matrix, each pixel having a photoelectric conversion unit and a circuit that outputs a pulse signal indicative of incidence of photon in response to incidence of light on the photoelectric conversion unit,
   the second circuit board comprises a counter region in which a plurality of counters that count pulse signals from the plurality of pixels are arranged in a matrix, and a peripheral circuit region including a circuit that controls driving of the plurality of pixels and the plurality of counters,
   the pixel region includes a first region having a plurality of first pixels whose photoelectric conversion units are shielded from light and a second region having a plurality of second pixels whose photoelectric conversion units are not shielded from light,
   the counter region includes a plurality of first counters that count pulse signals from the plurality of first pixels, and a plurality of second counters that count pulse signals from the plurality of second pixels,
   at least part of the peripheral circuit region in the second circuit board is arranged in a region that overlaps with the first region of the first circuit board, and
   each unit is implemented by one or more processors, circuitry or a combination thereof.

2. The image sensor according to claim 1, wherein a surface area of each of the first counters is smaller than a surface area of each of the second counters.

3. The image sensor according to claim 2, wherein a maximum value that can be counted by each of the first counters is smaller than a maximum value that can be counted by each of the second counters.

4. The image sensor according to claim 1, wherein each of the first counters counts pulse signals from a first number of the first pixels, the first number being a plural number.

5. The image sensor according to claim 4, wherein a surface area of each of the first counters is smaller than a total surface area of the first plural number of the second counters.

6. The image sensor according to claim 4 further comprising a control unit that controls so that pulse signals output from the first number of the first pixels do not simultaneously enter each of the first counters,
   wherein the control unit is implemented by one or more processors, circuitry or a combination thereof.

7. The image sensor according to claim 1, wherein each of the pixels outputs a pulse signal in response to dark current.

8. The image sensor according to claim 1 further comprising a correction unit that corrects count values counted by the second counters using count values counted by the first counters,
   wherein the correction unit is implemented by one or more processors, circuitry or a combination thereof.

9. An image capturing apparatus comprising:
   an image sensor in which a first circuit board and a second circuit board which is different from the first circuit board are stacked so as to overlap each other, wherein
      the first circuit board comprises a pixel region in which a plurality of pixels are arranged in a matrix, each pixel having a photoelectric conversion unit and a circuit that outputs a pulse signal indicative of incidence of photon in response to incidence of light on the photoelectric conversion unit,
      the second circuit board comprises a counter region in which a plurality of counters that count pulse signals from the plurality of pixels are arranged in a matrix, and a peripheral circuit region including a circuit that controls driving of the plurality of pixels and the plurality of counters,
      the pixel region includes a first region having a plurality of first pixels whose photoelectric conversion units are shielded from light and a second region having a plurality of second pixels whose photoelectric conversion units are not shielded from light,
      the counter region includes a plurality of first counters that count pulse signals from the plurality of first pixels, and a plurality of second counters that count pulse signals from the plurality of second pixels, and
      at least part of the peripheral circuit region in the second circuit board is arranged in a region that overlaps with the first region of the first circuit board; and
   a correction unit that corrects count values counted by the second counters using count values counted by the first counters,
   wherein each unit is implemented by one or more processors, circuitry or a combination thereof.

* * * * *